United States Patent [19]

Murakami

[11] Patent Number: 5,462,603
[45] Date of Patent: Oct. 31, 1995

[54] SEMICONDUCTOR PROCESSING APPARATUS

[75] Inventor: Seishi Murakami, Koufu, Japan

[73] Assignee: Tokyo Electron Limited, Tokyo, Japan

[21] Appl. No.: 265,139

[22] Filed: Jun. 24, 1994

[30] Foreign Application Priority Data

Jun. 24, 1993 [JP] Japan .................................. 5-179845

[51] Int. Cl.⁶ .................................................. C23C 16/00
[52] U.S. Cl. ..................... 118/719; 118/724; 118/725; 118/728; 118/729
[58] Field of Search ................................ 118/724, 725, 118/728, 729, 719

[56] References Cited

U.S. PATENT DOCUMENTS 5,177,878  1/1993  Visser .......................................... 34/92
5,252,807  10/1993  Chizinsky ................................. 118/724

FOREIGN PATENT DOCUMENTS

0480735  4/1992  European Pat. Off. .
WO93/13241  7/1993  WIPO .

*Primary Examiner*—Richard Bueker
*Attorney, Agent, or Firm*—Oblon, Spivak, McClelland, Maier & Neustadt

[57] ABSTRACT

A CVD apparatus for a semiconductor wafer comprises a process chamber made of aluminum. A cylindrical quartz made case having a lower end opening is provided in the process chamber to mount the wafer. A flange of the lower end of the case is airtightly connected to a bottom wall of the process chamber to surround an opening formed in the bottom wall of the process chamber. The inner space of the case is airtightly isolated from a process space. The opening of the bottom wall is closed by a cover from the outside of the process chamber. A resistance heating body is provided in the case to be opposite to a top plate. Feed lines, and a thermocouple are introduced into the case from an atmospheric side through the cover. An inactive gas supply pipe and an exhausting pipe are connected to the cover. The inside of the case is in an inactive gas atmosphere, and oxidation of the resistance heating body is prevented.

13 Claims, 5 Drawing Sheets

SEMICONDUCTOR PROCESSING APPARATUS

BACKGROUND OF THE INVENTION

1. Field of the Invention

The present invention relates to a semiconductor processing apparatus for processing a substrate, such as a semiconductor wafer or an LCD substrate, by heating the substrate in a process gas atmosphere.

2. Description of the Related Art

A CVD (Chemical Vapor Deposition) apparatus is known as an apparatus for processing a semiconductor wafer, such as a silicon wafer, or a glass substrate for LCD. In the CVD apparatus, it is important to equally heat an entire surface of the wafer at a predetermined temperature so as to uniformly form a thin film on the wafer.

Figure 6:
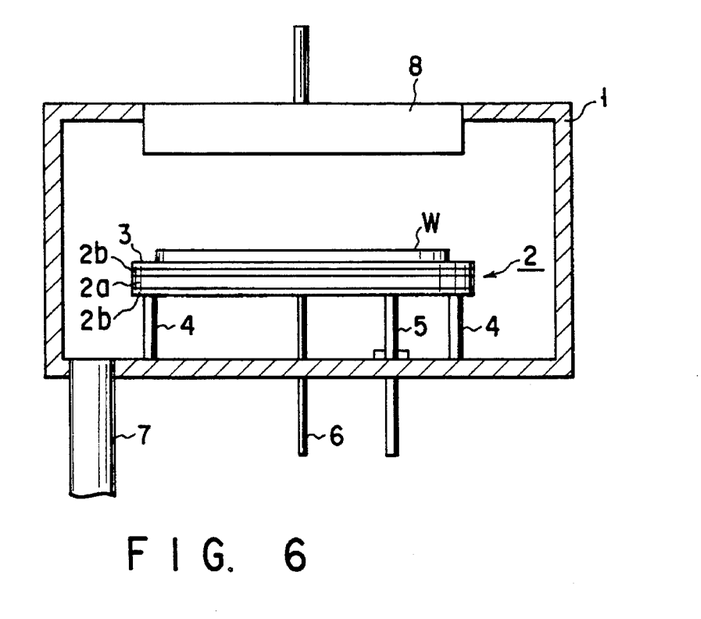
FIG. 6 is a vertical cross sectional side view showing a conventional CVD apparatus.

FIG. 6 shows a conventional CVD apparatus using a resistance heater. In this apparatus, a work table 2 is provided to be supported by a support 4 in a lower portion of a process space defined by a vacuum process chamber 1. The work table 2 comprises a resistance heating body 2a and electrical insulating plates 2b, 2b superimposed on both sides of the heating body 2a. A graphite plate 3, which forms a wafer mounting surface, is layered on the surface of the upper insulating plate 2b. A feeder 5 is connected to the resistance heating body 2a. The feeder 5 is surrounded by a sheath wire (not shown), and drawn to the outside of the process chamber 1. A sheath thermocouple 6, which stores a thermocouple in the sheath wire, contacts the resistance heating body 2a.

In such a film forming apparatus, the inside of the process chamber 1 is exhausted to obtain a predetermined degree of vacuum. Then, a process gas is supplied thereto from a gas supply section 8 in a state that the predetermined degree of vacuum is maintained. Moreover, electric power is supplied to the resistance heating body 2a through the feeder 5, and a temperature of a wafer W is controlled to be a predetermined temperature based on a temperature detecting value of the sheath thermocouple 6.

As a resistance heater, there is known a ceramic heater wherein a resistance heating wire is buried in a ceramic plate and a wafer is mounted on the ceramic plate.

In the CVD apparatus, there is a case in which a corrosive gas is used as a process gas or a corrosive gas is generated by reaction of a process gas. For example, in a case that a halide gas is used, a halogen gas having strong corrosiveness is generated by vapor phase reaction. Moreover, since the temperature is increased during a process, corrosiveness of the halogen gas is extremely strong. Due to this, the feeder 5, the resistance heating body 2a, and their terminals, which are exposed in the process gas atmosphere, are corroded.

When the circuit elements are corroded, the resistance value of the resistance heater is increased. As a result, a current supplied to the heater is deviated from a predetermined value, and breaking of wire occurs. Beside the corrosion problem, in forming a conductive film, e.g., a metallic film on the wafer, the metallic film is adhered to the portion between the terminals of the feeder 5 and a short circuit is caused. This can also prevent the electric power from being stably supplied to the resistance heater. Due to this, the temperature of wafer W becomes unstable, and the thickness and the property of a formed film are less uniform over the entire surface of the wafer W.

Also, there are problems in the thermocouple as follows.

More specifically, the thermocouple is exposed in the process chamber 1, and the response changes depending on the degree of vacuum. For example, when pressure is largely changed by the supply of a process gas, the temperature is overshot, and the detection of the temperature is not correctly performed. Due to this, when forming the film, the heater temperature and the wafer temperature become unstable, and the stable film forming process cannot be performed.

If the ceramic heater is used, the above disadvantage can be relaxed, since the resistance heating wire is not directly exposed in the process gas atmosphere. However, if the sheath wire and the ceramic plate are directly bonded, a crack is generated in the ceramic by the difference in the coefficient of thermal expansion. Due to this, the terminals of the resistance heating wire cannot help being exposed. Therefore, there occurs a problem of corrosion therein.

Moreover, the ceramic heater has an extremely large heat capacity, and can be neither rapidly heated nor cooled. Due to this, it is needed that the ceramic heater be maintained in an ON state during wafer exchange when a plurality of wafers are processed. However, if the wafer W is mounted on the ceramic heater, which is maintained in a heating state, the wafer is rapidly heated from the room temperature, and subjected to heating damage. Moreover, there is a problem in that a transfer arm for dealing with the wafer is deformed by heat.

SUMMARY OF THE INVENTION

An object of the present invention is to provide a semiconductor processing apparatus, which can stably supply electric power to a resistance heater, thereby providing a stable process to a target substrate.

According to the present invention, there is provided a semiconductor processing apparatus comprising:

a process chamber for defining a process space storing a substrate to be processed in an airtight state, the chamber including a gate for opening/closing a passage for passing the substrate;

means for supplying a process gas to the process space of the chamber;

means for exhausting the process space of the chamber;

supporting means for supporting the substrate provided in the process space of the chamber;

a case arranged in the process space of the chamber to cover an opening formed in a wall of the chamber, the case defining an inner space airtightly isolated from the process space, having a main plate which is made of a light transmissive material, faces to the substrate supported by the supporting means, and has a flat outer surface with a larger contour than a contour of the substrate;

a cover for closing the opening of the chamber to close the case;

a resistance heating body provided in the inner space of the case to be adjacent to the main plate;

a feeder introduced into the inner space of the case from the outside of the chamber, for applying an electric power to the resistance heating body;

a temperature measuring member introduced into the inner space of the case from the outside of the chamber, for measuring the temperature of the resistance heating body;

means for supplying an inactive gas to the inner space of the case from the outside of the chamber; and means for exhausting the inactive gas from the inner space of the case to the outside of the chamber.

According to the semiconductor processing apparatus of the present invention, since the resistance heating body and the feeder do not contact the process gas, the resistance heating body and the feeder are not corroded even if a corrosive gas is used as the process gas. Moreover, there is no such case that the conductive film is adhered to the portion between the terminals and the short circuit occurs. As a result, electric power can be stably supplied to the resistance heating body. Although the temperature of the inside of the case becomes high, the resistance heating body and the feeder can be prevented from being oxidized since the inside of the case is in an inactive gas atmosphere. Since the thermocouple is airtightly isolated from the atmosphere of the process chamber, the response of the thermocouple is not influenced by the change of pressure of the process chamber, so that the temperature control can be stabilized. If the inner space of the case is also airtightly isolated from the atmosphere and a difference in pressure between the case and the process chamber is made small, a case having a small withstand pressure can be used.

Additional objects and advantages of the invention will be set forth in the description which follows, and in part will be obvious from the description, or may be learned by practice of the invention. The objects by means of the instrumentalities and combinations particularly pointed out in the appended claims.

BRIEF DESCRIPTION OF THE DRAWINGS

The accompanying drawings, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENTS

Figure 1:
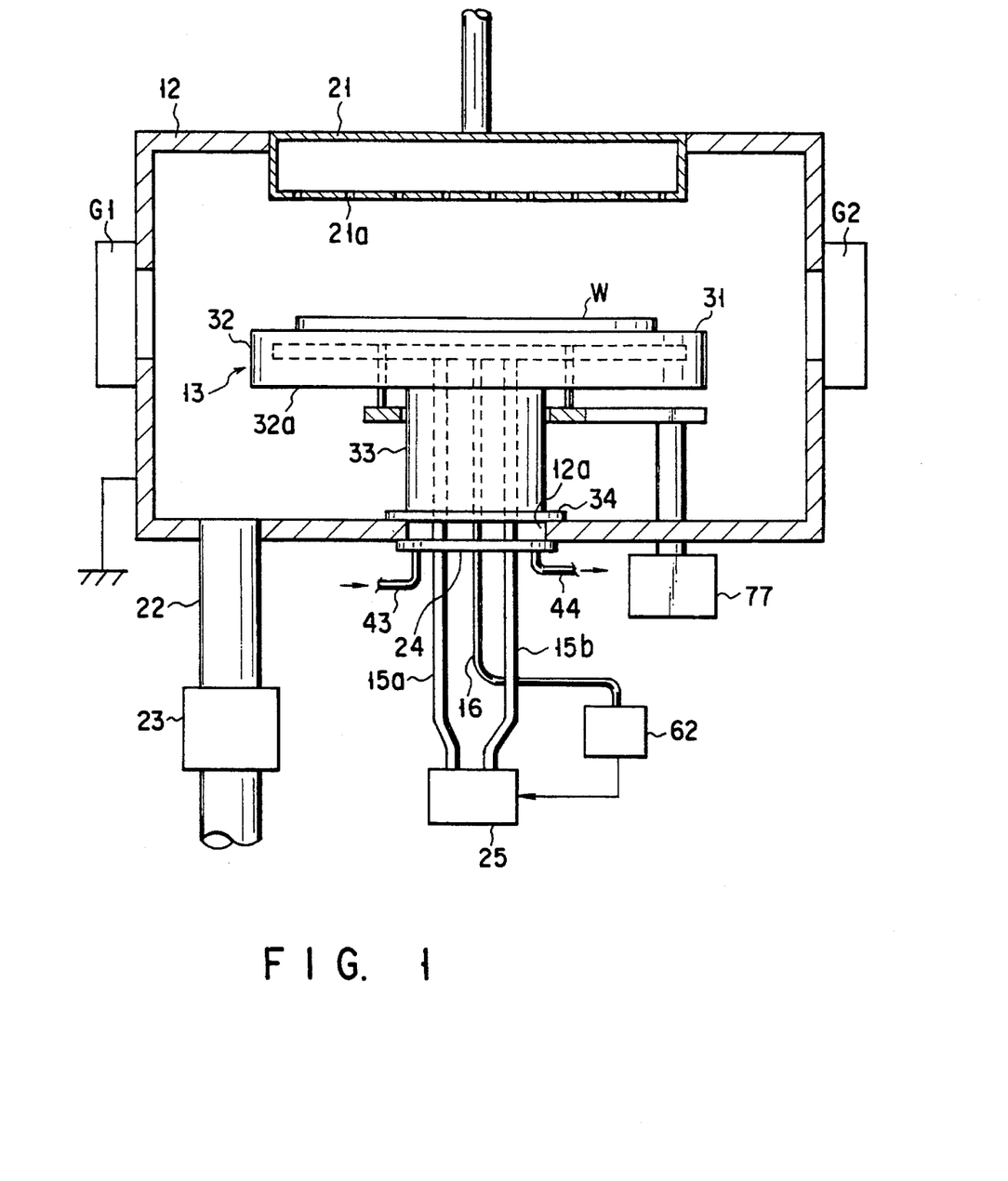
FIG. 1 is a vertical cross sectional side view showing the entire CVD apparatus according to an embodiment of the present invention.

A CVD apparatus according to an embodiment of the present invention, shown in FIG. 1, comprises an airtight structure defining a process space, that is, a process chamber 12 formed of aluminum. A shower head 21 for supplying process gas to the process chamber 12 is provided on the upper portion of the process chamber 12. The shower head 21 has a plurality of holes 21a on the lower surface opposite to a semiconductor wafer W, which is a substrate to be processed, and supplies a process gas as parallel downflows.

An exhaust pipe 22 is connected to the bottom portion of the process chamber 12, and the inside of the process chamber 12 can be maintained to be a predetermined degree of vacuum by a vacuum pump 23. Gates G1 and G2 are provided on side walls of the process chamber 12 so as to open/close paths connecting to a load lock chamber (not shown), respectively.

Figure 2:
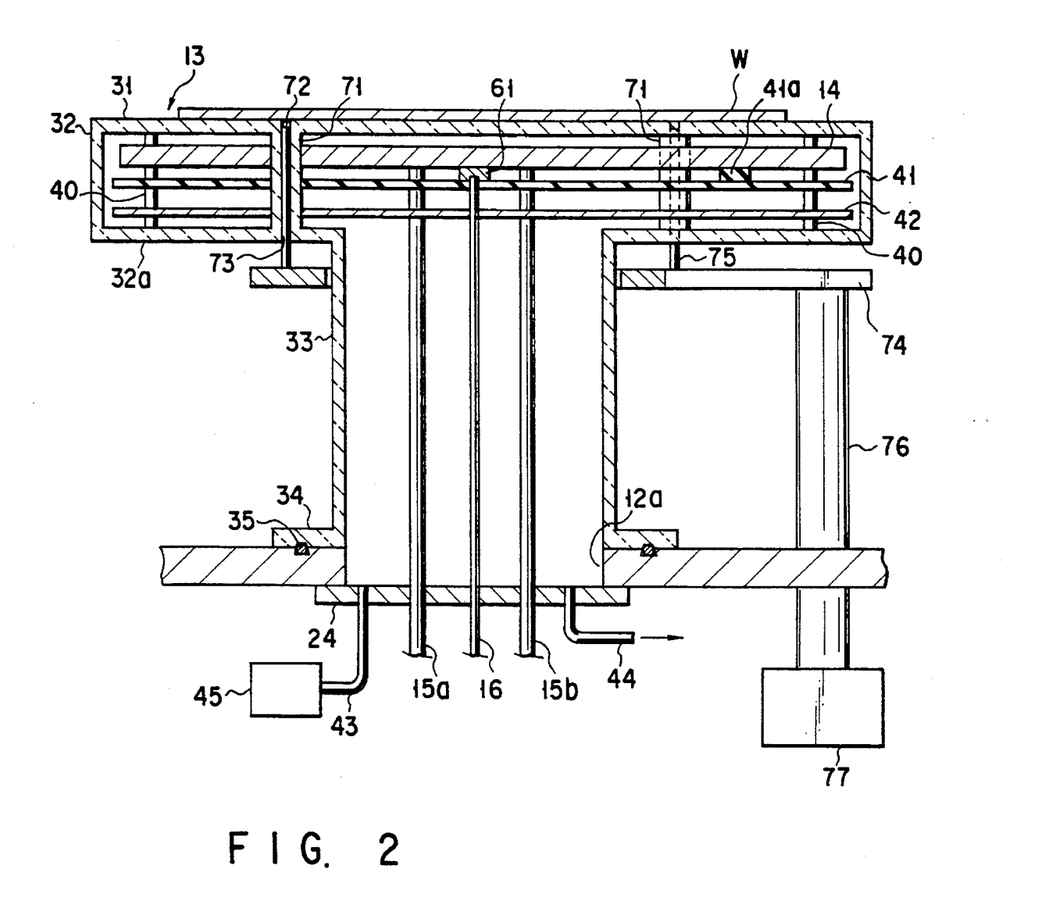
FIG. 2 is a cross sectional view showing a main part of the apparatus of FIG. 1.
Figure 3:
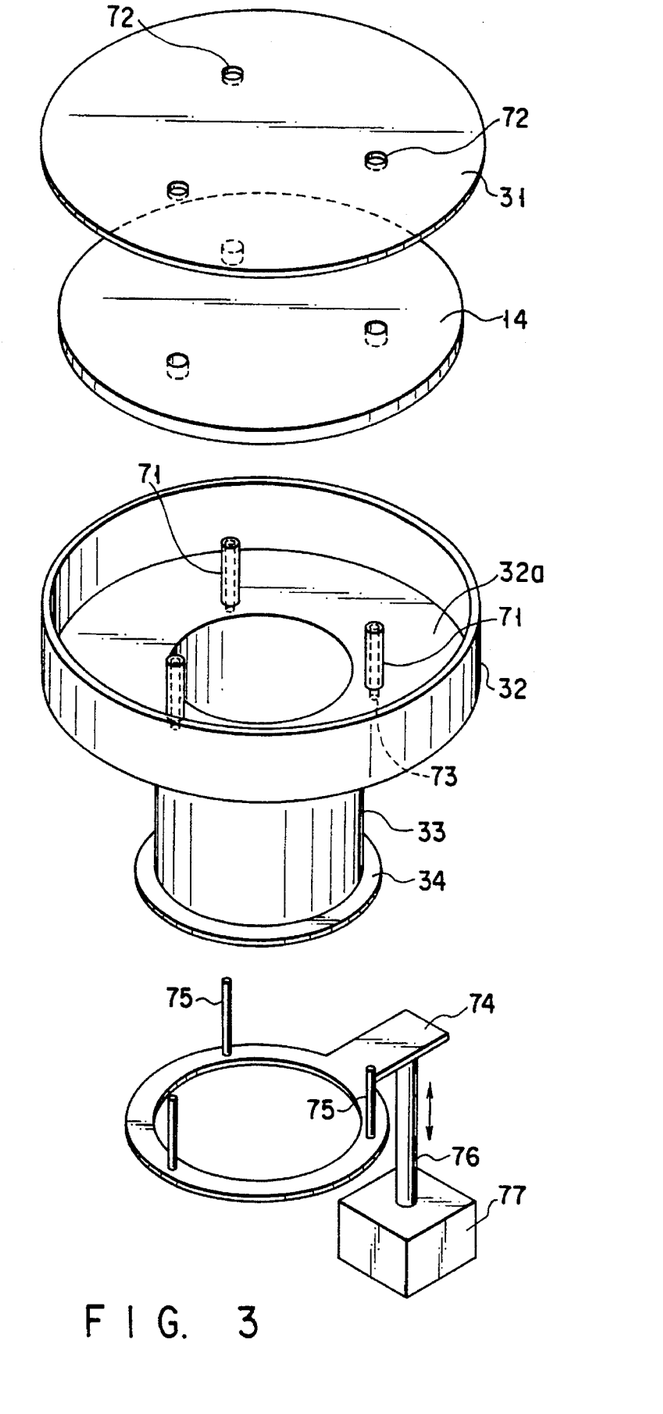
FIG. 3 is an exploded perspective view showing the main part of the apparatus of FIG. 1.

A table-shaped case 13 is provided on the bottom of the process chamber 12 so as to be opposite to the shower head 21. The entire of the case 13 is formed of a material through which thermal energy is effectively transmitted, such as quartz, sapphire, $SiO_2$, $Al_2O_3$, or AlN, preferably quartz or $SiO_2$. As shown in FIGS. 2 and 3, the case 13 comprises an upper cylindrical portion 32 having a large diameter and a lower cylindrical portion 33 having a small diameter, which are arranged concentrically with each other.

The upper portion of the upper cylindrical portion 32 is airtightly closed by a top plate 31 whose entire thickness is uniform. The upper surface of the top plate 31 is formed to be a flat mounting surface for mounting the wafer W, which is a substrate to be processed. The contour of the top plate 31 is larger than that of the wafer W. In other words, the top plate 31 has a diameter larger than the diameter of the wafer W. Since the wafer W normally has a uniform thickness, both sides of the wafer W and the mounting surface of the top plate 31 are substantially parallel to each other.

The bottom portion of the upper cylindrical portion 32 airtightly communicates with the lower cylindrical portion 33 through a bottom plate 32a having an opening on its center. The bottom portion of the lower cylindrical portion 33 is opened, and a flange 34 is provided around the bottom portion. The flange 34 is airtightly fixed to the bottom wall of the process chamber 12 with an O-ring 35 interposed therebetween. In other words, the case 13, which comprises the top plate 31, upper and lower cylindrical portions 32 and 33, the bottom plate 32a, and the flange 34, defines the inner space, which is airtightly isolated from the process space of the process chamber 12. The respective parts of the case 12 are formed part by part, and bonded to each other by welding.

An opening 12a is formed at the bottom wall of the process chamber 12 to correspond to the lower end opening of the lower cylindrical portion 3. The opening 12a is closed by a cover 24 attached from the outside of the process chamber 12.

A resistance heating body 14 is provided under the top plate 31 in the upper cylindrical portion 32 of the case 13. The resistance heating body 14 can be formed of a resistance heating material such as graphite, tungsten, molybdenum, tantalum, or nickel chromium alloy. The resistance heating body 14 can be formed to be an arbitrary shape such as spiral, S-shape, disk-shape as long as a predetermined heating distribution can be obtained in an area which has a contour larger than the contour of the wafer W on the top plate 31 and is parallel to the wafer W. According to the embodiment of the present invention, the resistance heating body is formed of graphite, and the shape is a disk having a larger diameter than the wafer and a uniform thickness. Also, the resistance heating body of the present embodiment is arranged parallel to the top plate 31.

A support plate 41, which is formed of an electrical insulating material such as $Al_2O_3$, and a reflector 42 whose upper surface is finished as a mirror surface, are provided under the resistance heating body 14. The resistance heating body 14, the support plate 41, and the reflector 42 are supported by a support 40, which is formed of the same material as the case 3, e.g., quartz or $SiO_2$, and is perpendicularly set up between the top plate 31 and the bottom plate 32a. A plurality of shoes 41a for supporting the resistance heating body 14 is provided on the upper surface of the support plate 41 to prevent the resistance heating body 14 from deflecting. The reflector 42 is formed of e.g., a metallic mirror plate, and used to reflect upward the radiation heat, that is heat energy, which is emitted from the resistance heating body 14, and from the support plate 41 heated by the resistance heating body 14. Thereby, the rise of the temperature of the bottom portion of the process chamber 12 is suppressed. In FIG. 3, the support plate 41 and the reflector 42 are omitted for convenience.

Two feed lines 15a, 15b, for example, are connected to the resistance heating body 14. The feed lines 15a and 15b also are connected to a power source 25 outside the process chamber 12 through the cover 24 (FIG. 1). A small annular projection 61, which is formed of material having a high coefficient of thermal conductivity, is provided at the center of the resistance heating body 14. A thermocouple 16 for measuring temperature is inserted into the annular projection 61 in a sealed state. The thermocouple 16 is connected to a temperature controller 62 outside the process chamber 12 through the cover 24 from the inner space of the lower cylindrical portion 33 (FIG. 1).

The resistance heating body 14 may be divided into a plurality of heating areas so as to control the temperature individually. In this case, a feed line common to the heating areas of the divided resistance heating body 14, and a feed line and a thermocouple corresponding to each heating area may used.

A supply pipe 43 for supplying an inactive gas and an exhaust pipe 44 are connected to the cover 24. The supply pipe 43 is connected to an inactive gas source 45, and the exhaust pipe 44 is connected to a plant exhaust stack duct (not shown). The inactive gas flows into the case 13 by use of the pipes 43 and 44, so that the inside of the case 13 is set to an inactive gas atmosphere. As the inactive gas, $N_2$ (nitrogen) and an inert gas, such as He (helium) or Ar (argon), is used. Nitrogen is used when a process temperature of the process chamber 12 is lower than about 500° C., at which it does not nitride the components.

In the upper cylindrical portion 32 of the case 13, three pipes 71 are provided at positions, which are arranged at regular intervals in a circumferential direction, to extend perpendicularly between the top plate 31 and the bottom plate 32a. An axial hole of each pipe 71 communicates with the process space of the process chamber 12 through holes 72 and 73 formed in the top plate 31 and the bottom plate 32a, respectively. The pipe 71 is airtightly connected to the top plate 31 and the bottom plate 32a by welding, so that the inner space of the case 13 does not communicate with the process space.

Three lift pins 75 are fixed to a ring-shaped lift plate 74. Each lift pin 75 is movably inserted into the inner bore of the corresponding pipe 71 so as to project and retreat to/from the mounting surface of the top plate 31. The lift plate 74 is connected to a driving member 77 for moving up and down through a shaft 76 inserted into the process chamber 12 from its bottom wall. A portion where the shaft 76 passes through the bottom wall of the process chamber 12 is airtightly sealed.

The following will explain an operation of the CVD apparatus.

The wafer W, which is the target substrate, is transferred into the process chamber 12 through a gate G1 by transfer means (not shown). The wafer W is transferred onto the three lift pins 75, which are projected from the top plate 31 by the driving member 77. Thereafter, the lift pins 75 are moved down, so that the wafer W is mounted on the top plate 31. The process chamber 12 is exhausted by the vacuum pump 23 to be set to a predetermined degree of vacuum.

A voltage is applied to the resistance heating body 14 through feed lines 15a and 15b, and the resistance heating body 14 is heated. Heat of the resistance heating body 14 is applied to the wafer W as radiation heat through the top plate 31 made of quartz or $SiO_2$. At this time, although an inactive gas flows from the pipe 43 to the pipe 44 through the inside of the case 13, the inside of the case 13 is maintained to be under substantially atmospheric pressure.

The temperature of the resistance heating body 14 is detected by the thermocouple 16, and the detected value is inputted into a temperature controller 62. Based on the input, electrical power imparted to the resistance heating body 14 is controlled so as to control the temperature of the resistance heating body 14. Thereby, the temperature of the wafer W is set to a predetermined process temperature. Also, in a state that the process chamber 12 is exhausted by the pump 23, a process gas e.g., the mixture of $WF_6$ and $H_2$ is supplied to the process chamber 12 through the shower head 21 at a predetermined flow rate. Thereby, a CVD film, e.g., a tungsten film, if the above process gas is used, is formed on the surface of the wafer W.

Since the resistance heating body 14 and the feed lines 15a and 15b are stored in the inner space of the case 13, which is airtightly isolated from the atmosphere of the process chamber 12, the resistance heating body 14 and the feed lines 15a and 15b are not corroded even if a corrosive gas is used as the process gas.

Although the temperature of the inside of the case 13 becomes high, the resistance heating body and the feed line terminals can be prevented from being oxidized, since the inside of the case is kept to be an inactive gas atmosphere. In other words, increase in the resistance value and the breaking of wire due to the corrosion and oxidation of these members can be prevented in advance. Moreover, there is no such a case that the conductive film is adhered to the portion between the terminals of the feed lines 15a and 15b and the short circuit occurs. As a result, electric power can be stably supplied to the resistance heating body 14, and the temperature control of the wafer W can be surely performed.

Even if a CVD film, e.g., metallic film is adhered onto the mounting surface of the top plate 31, the temperature of the portion to which the metallic film adhering can be prevented from being locally increased, since the wafer W is mounted on the mounting surface of the top plate 31. As a result, there is no possibility that quartz is cracked.

Since the resistance heating body 14 does not contact a body having a large heat capacity, the resistance heat body 14 can be rapidly heated or cooled. Due to this, it is possible to perform a temperature control in which the heater is turned off at the time of non-processing the wafer and turned on at the time of transferring the wafer. In other words, it is possible to perform the temperature control in which the wafer W is gradually increased from the room temperature to the process temperature, and gradually decreased from the process temperature. Thereby, thermal stress, which is generated in the wafer, can be suppressed.

Since the thermocouple 16 is also airtightly isolated from the atmosphere of the process chamber 12, the response of the thermocouple 16 is not influenced by the change of the pressure of the process chamber 12. For example, even if the pressure of the process chamber 12 is largely changed, no error occurs in the temperature measurement, and the temperature control can be surely performed.

The diameter of the lower cylindrical portion 33 of the case 13 is smaller than that of the upper cylindrical portion 32, and thermal loss to the lower portion of the case 13 due to heat conduction is small. As a result, unfavorable heat influence is less exercised on the O-ring 35, which seals the case 13 and the bottom wall of the process chamber 12.

Figure 4:
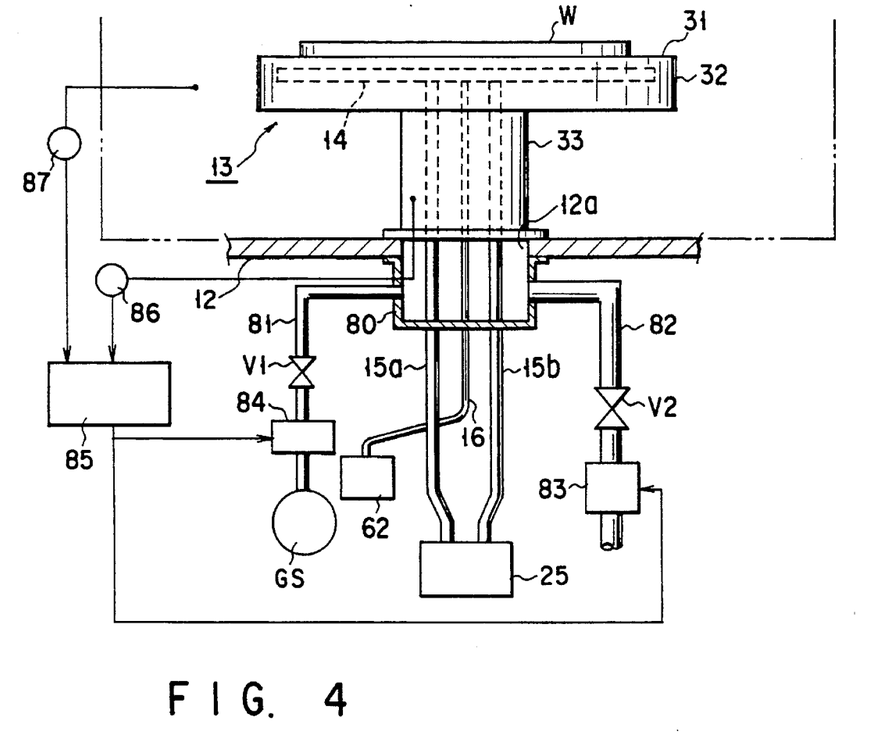
FIG. 4 is a vertical cross sectional side view showing the modification of the apparatus of FIG. 1.

FIG. 4 shows a view showing another embodiment of the present invention in which the apparatus of FIG. 1 is modified. In this embodiment, the opening 12a of the bottom wall of the process chamber 12, which is aligned with the lower end opening of the case 13, is closed by a housing member 80 having an airtight structure in place of the cover 24 of FIG. 1. The inside of the case 13 is airtightly isolated from the atmospheric side by the housing 80. In addition to the feed lines 15a and 15b, and the thermocouple 16, two pipes 81 and 82 for controlling pressure are connected to the housing 80. The pipe 81 is connected to an inactive gas source GS through a valve V1, and a mass flow controller 84 (MFC). The pipe 82 is connected to a vacuum pump 83 through a valve V2. The pumps 83 and MFC 84 are operated by a controller 85, and pressure of the case 13 is controlled. In the case 13, there is arranged a terminal of a pressure sensor 86, which is connected to the controller 85. Moreover, in the process chamber 12, a terminal of a pressure sensor 87, which is connected to the controller 85, is arranged.

There are used two methods for controlling pressure of the case 13 in this modification. One is a method for forcibly maintaining pressure of the case 13 to be an arbitrary predetermined value. In this case, unlike the embodiment of FIG. 1, where the case 13 is set to be substantially the atmospheric pressure, the case 13 is set to be below the atmospheric pressure, e.g., a value close to degree of vacuum of the process chamber 12. If the pressure of the case 13 is lowered, the response of the thermocouple 16 is lowered. However, if the pressure is constant, the response of the thermocouple 16 can be made constant. The other is a method for maintaining a difference in pressure between the case 13 and the process chamber 12 to be a zero or a low constant value.

As explained in the above two methods, if the difference in pressure between the case 13 and the process chamber 12 is made small, the withstand pressure of the case 13, that is, strength may be low, and the plate for forming the case 13 can be thinned. This is advantageous to the case when the size of the apparatus is enlarged as the CVD apparatus for LCD substrate.

Figure 5:
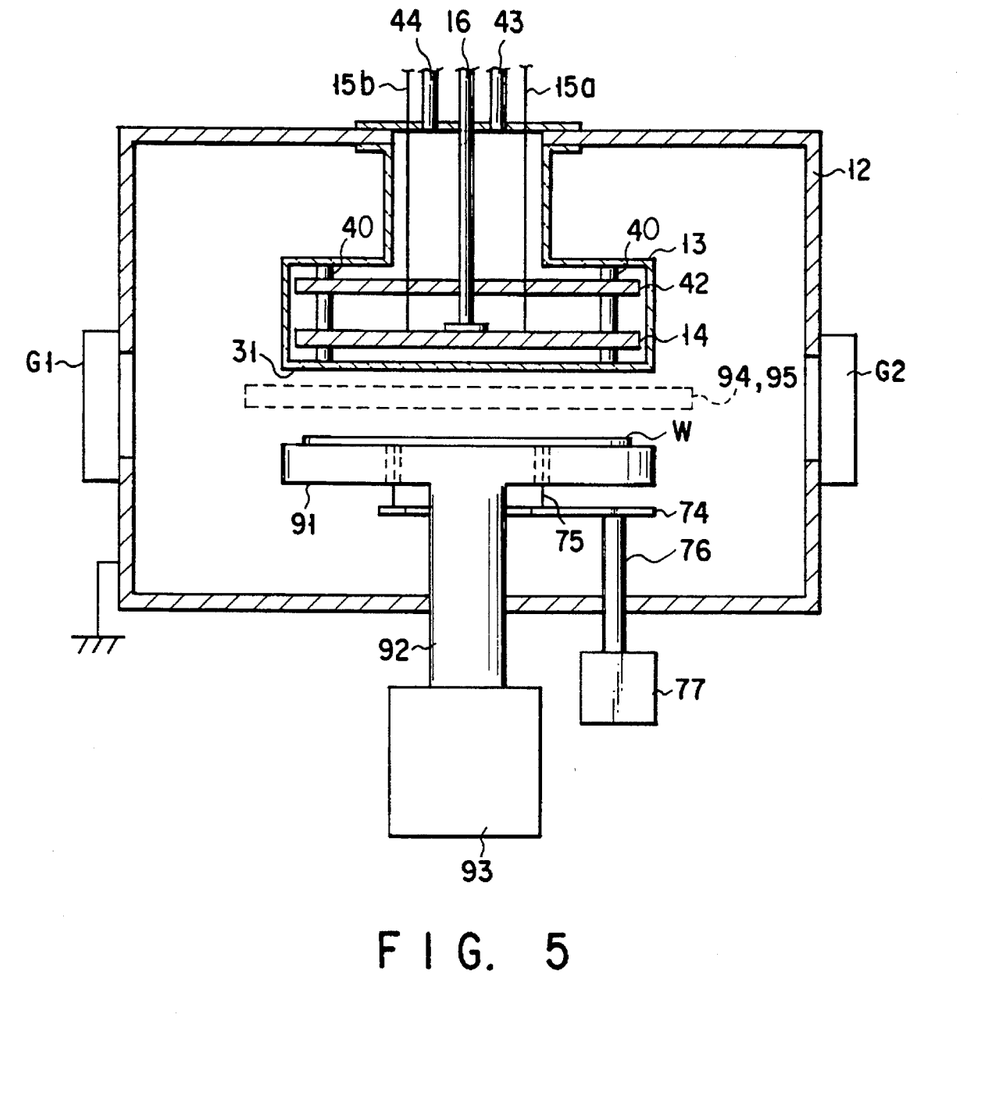
FIG. 5 is a vertical cross sectional side view showing the entire CVD apparatus according to another embodiment of the present invention.

FIG. 5 shows a CVD apparatus according to another embodiment of the present invention. In the figure, the same reference numerals are added to the members, which substantially correspond to the members of FIGS. 1 to 3, respectively.

In this embodiment, the quartz-made case 13, which is similar to the case 13 of FIGS. 1 to 3 excepting the point that no hole for lift pin 75 is provided, is attached to the top wall of the process chamber 12 in a reverse manner. The lowermost plate 31 of the case 13 is provided to be opposite to and parallel to the upper surface (surface to be processed) of the wafer W mounted on a work table 91 through a gap. In the case 13, the resistance heating body 14 is provided in the vicinity of the plate 31 such that the wafer W can be heated.

The work table 91 is supported by a driving member 93 for moving up and down, which is provided outside the process chamber 12, through a shaft 92, which airtightly passes through the bottom wall of the process chamber 12. The work table 91 is moved down by the driving member 93, and the gap between the lowermost plate 31 and the work table 91 is expanded, when the wafer W is mounted thereon. After mounting the wafer, the work table 91 is lifted by the driving member 93, and the gap between the lowermost plate 31 and the work table 91 is set to a predetermined value for a process.

A slit 94 is formed in one wall, which is perpendicular to the walls on which gates G1 and G2 are provided. The slit 94 is connected to a process gas source for film formation. A slit 95 is formed on the other wall opposite to the slit 94. The slit 95 is connected to the vacuum pump. At the time of forming a film, a process gas flow is formed between the slits 94 and 95 to be parallel to the surface of the wafer W.

Similar to the aforementioned embodiment, in this embodiment, since the resistance heating body 14 and the feed lines 15a and 15b are stored in the inner space of the case 13, which is airtightly isolated from the atmosphere of the process chamber 12, the resistance heating body 14 and the feed lines 15a and 15b are not corroded even if a corrosive gas is used as the process gas. Although the temperature inside the case 13 becomes high, the resistance heating body and the feeder terminal can be prevented from being oxidized, since the inside of the case is in an inactive gas atmosphere. In other words, increase in the resistance value and the breaking of wire due to the corrosion and oxidation of these members can be prevented in advance. Moreover, there is no such case that the conductive film is adhered to the portion between the terminals of the feed lines 15a and 15b and the short circuit occurs. As a result, electric power can be stably supplied to the resistance heating body 14, and the temperature control of the wafer W can be surely performed.

In the above-mentioned embodiments, only the plate 31 opposite to the resistance heating body 14 may be formed of light transmissive material, e.g., quartz and the parts of the case 13 may be formed of light non-transmissive materials, e.g., metal. In this case, the inner surface of the portion of the case 13, which is formed of metal, is finished as a mirror surface, thereby omitting the reflector 42. However, there remains difficulty in airtightly bonding different types of materials. It is possible to extract the feed lines 15a and 15b and the thermocouple 16 from the case 13 to the outside of the process chamber 12 in not upper and lower directions but a lateral direction.

As a substrate to be processed in the semiconductor processing apparatus of the present invention, there can be included a wafer, which is formed of a semiconductor, quartz, glass, etc., and a substrate for LCD. As a semiconductor processing apparatus of the present invention, there can be named a diffusion apparatus including an oxidation apparatus, an anneal apparatus, etc.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor processing apparatus comprising:
   a process chamber for defining a process space storing a substrate to be processed in an airtight state, said chamber including a gate for opening/closing a passage for passing said substrate;

means for supplying a process gas to said process space of said chamber;

means for exhausting said process space of said chamber;

a case arranged in said process space of said chamber to cover an opening formed in a wall of said chamber, said case being entirely made of substantially the same light transmissive material, said case comprising a container portion having top and bottom plates, and a duct portion substantially smaller than said container portion and connecting said container portion to said opening, said top plate having a flat outer surface with a larger contour than a contour of said substrate, on which said substrate is mounted, said bottom plate being located separate from a bottom wall of said chamber;

a resistance heating body arranged in said container portion;

a reflecting plate arranged between said resistance heating body and said bottom plate in said container portion, for reflecting radiation heat generated by said resistance heating body to said top plate;

a feeder for applying an electric power to said resistance heating body;

a temperature measuring member introduced in said container portion for measuring the temperature of said resistance heating body;

means for supplying an inactive gas to said inner space of said case;

means for exhausting said inactive gas from said inner space of said case to the outside of said chamber;

a cover closing said opening of said chamber to close said case, said feeder, temperature measuring member, and means for supplying and exhausting said inactive gas being arranged to pass through said cover and in said duct portion between the outside of said chamber and said inner space of said case without passing said process space;

a plurality of lift pins for moving up and down said substrate, said lift pins being respectively inserted in through-holes vertically passing through said inner space of said case, said through-holes being respectively defined by tubes made of said light transmissive material and connected to said top and bottom plates such that said through-holes are airtightly isolated from said inner space of said case;

a support arranged between said bottom plate of said case and said bottom wall of said chamber, and supporting said lift pins; and driving means for vertically moving said support between said bottom plate of said case and said bottom wall of said chamber.

2. The apparatus according to claim 1, wherein said resistance heating body has a heating area having a contour larger than the contour of said substrate and being parallel to said top plate.

3. The apparatus according to claim 1, wherein said means for supplying said process gas supplies a gas for forming a CVD film on said substrate.

4. The apparatus according to claim 1, further comprising adjusting means for adjusting a flow rate of said inactive gas to set pressure of said inner space of said case to be less than the atmospheric pressure.

5. The apparatus according to claim 4, further comprising means for detecting pressure of said inner space of said case and means for controlling said adjusting means based on data from said pressure detecting means so as to maintain pressure of said inner space of said case to be substantially constant.

6. The apparatus according to claim 4, further comprising a first pressure detecting means for detecting pressure of said inner space of said case, a second pressure detecting means for detecting pressure of said process space of said chamber, and means for controlling said adjusting means based on data from said first and second pressure detecting means so as to maintain a difference in pressure between said process space of said chamber and said inner space of said case to be substantially constant.

7. A semiconductor processing apparatus comprising:

a process chamber for defining a process space storing a substrate to be processed in an airtight state, said chamber including a gate for opening/closing a passage for passing said substrate;

means for supplying a process gas to said process space of said chamber;

means for exhausting said process space of said chamber;

a case arranged in said process space of said chamber to cover an opening formed in a bottom wall of said chamber, said case being entirely made of substantially the same light transmissive material, said case comprising a container portion located on an upper side and having top and bottom plates, and a duct portion located on a lower side, substantially smaller than said container portion and connecting said container portion to said opening, said top plate having a flat outer surface with a larger contour than a contour of said substrate, on which said substrate is mounted, said bottom plate being located separate from said bottom wall of said chamber, said container portion having a larger size than said duct portion in planes parallel to said top plate;

a resistance heating body arranged in said container portion;

a reflecting plate arranged between said resistance heating body and said bottom plate in said container portion, for reflecting radiation heat generated by said resistance heating body to said top plate;

a feeder for applying an electric power to said resistance heating body;

a temperature measuring member introduced in said container portion for measuring the temperature of said resistance heating body;

means for supplying an inactive gas to said inner space of said case;

means for exhausting said inactive gas from said inner space of said case to the outside of said chamber;

a cover closing said opening of said chamber to close said case, said feeder, temperature measuring member, and means for supplying and exhausting said inactive gas being arranged to pass through said cover and in said duct portion between the outside of said chamber and said inner space of said case without passing said process space;

a plurality of lift pins for moving up and down said substrate, said lift pins being respectively inserted in through-holes vertically passing through said inner space of said case, said through-holes being respectively defined by tubes made of said light transmissive material and connected to said top and bottom plates such that said through-holes are airtightly isolated from said inner space of said case;

a support arranged between said bottom plate of said case and said bottom wall of said chamber, and supporting said lift pins; and driving means for vertically moving said support between said bottom plate of said case and said bottom wall of said chamber.

8. The apparatus according to claim 7, wherein said support is formed of a ring-shaped plate which is arranged to surround said duct portion.

9. The apparatus according to claim 7, wherein said resistance heating body has a heating area having a contour larger than the contour of said substrate and being parallel to said top plate.

10. The apparatus according to claim 7, wherein said means for supplying said process gas supplies a gas for forming a CVD film on said substrate.

11. The apparatus according to claim 7, further comprising adjusting means for adjusting a flow rate of said inactive gas to set pressure of said inner space of said case to be less than the atmospheric pressure.

12. The apparatus according to claim 11, further comprising means for detecting pressure of said inner space of said case and means for controlling said adjusting means based on data from said pressure detecting means so as to maintain pressure of said inner space of said case to be substantially constant.

13. The apparatus according to claim 11, further comprising a first pressure detecting means for detecting pressure of said inner space of said case, a second pressure detecting means for detecting pressure of said process space of said chamber, and means for controlling said adjusting means based on data from said first and second pressure detecting means so as to maintain a difference in pressure between said process space of said chamber and said inner space of said case to be substantially constant.

* * * * *